(12) United States Patent
Shum et al.

(10) Patent No.: US 6,800,893 B2
(45) Date of Patent: Oct. 5, 2004

(54) SEMICONDUCTOR CIRCUIT CONFIGURATION AND ASSOCIATED FABRICATION METHOD

(75) Inventors: Danny Shum, Wappingers Falls, NY (US); Georg Tempel, Sterrebeek (BE)

(73) Assignee: Infineon Technoloiges AG, Munich (DE)

( * ) Notice: Subject to any disclaimer, the term of this patent is extended or adjusted under 35 U.S.C. 154(b) by 0 days.

(21) Appl. No.: 10/446,491

(22) Filed: May 28, 2003

(65) Prior Publication Data

US 2004/0004233 A1 Jan. 8, 2004

Related U.S. Application Data

(63) Continuation of application No. PCT/DE01/04008, filed on Oct. 22, 2001.

(30) Foreign Application Priority Data

Nov. 28, 2000 (DE) .......................................... 100 58 948

(51) Int. Cl.[7] .............................................. H01L 29/72
(52) U.S. Cl. ........................ 257/314; 257/315; 257/316; 257/317; 257/321; 365/185
(58) Field of Search ................................. 257/314, 315, 257/316, 317, 321; 365/185

(56) References Cited

U.S. PATENT DOCUMENTS

| | | | |
|---|---|---|---|
| 5,210,047 A | | 5/1993 | Woo et al. |
| 5,760,437 A | * | 6/1998 | Shimoji ...................... 257/316 |
| 6,037,223 A | | 3/2000 | Su et al. |

FOREIGN PATENT DOCUMENTS

| | | |
|---|---|---|
| FR | 2 375 692 | 7/1978 |
| JP | 08204159 | 8/1996 |
| JP | 08330550 A | 12/1996 |
| JP | 11330427 A | 11/1999 |

* cited by examiner

Primary Examiner—Edward Wojciechowicz
(74) Attorney, Agent, or Firm—Laurence A. Greenberg; Werner H. Stemer; Ralph E. Locher

(57) ABSTRACT

The invention relates to a semiconductor circuit configuration and to an associated fabrication method, in which a semiconductor substrate has a plurality of word lines and a plurality of bit lines for the row by row and column by column driving of a matrix of switching elements. In this case, a plurality of electrically conductive connection strips for connecting source and drain regions in the active region to the respective bit lines are formed between the word lines such that they directly make contact with the source and drain regions at the surface of the semiconductor substrate in the active region. In this way, a particularly compact cell area is obtained in conjunction with very simple lithographic conditions.

20 Claims, 8 Drawing Sheets

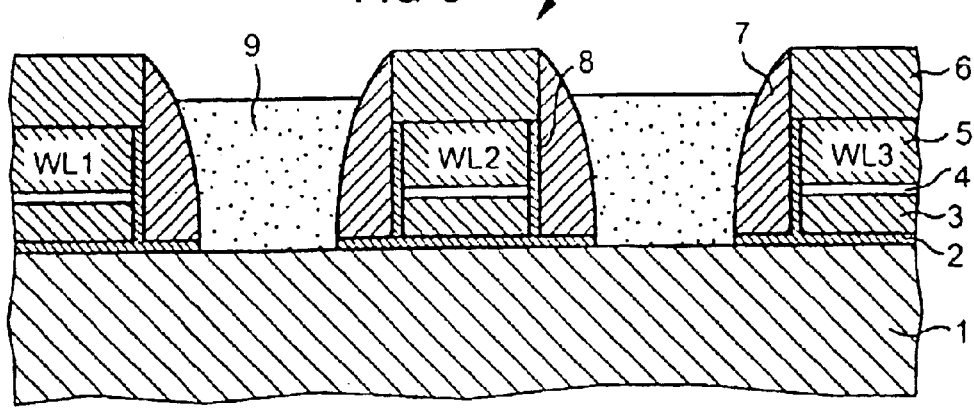
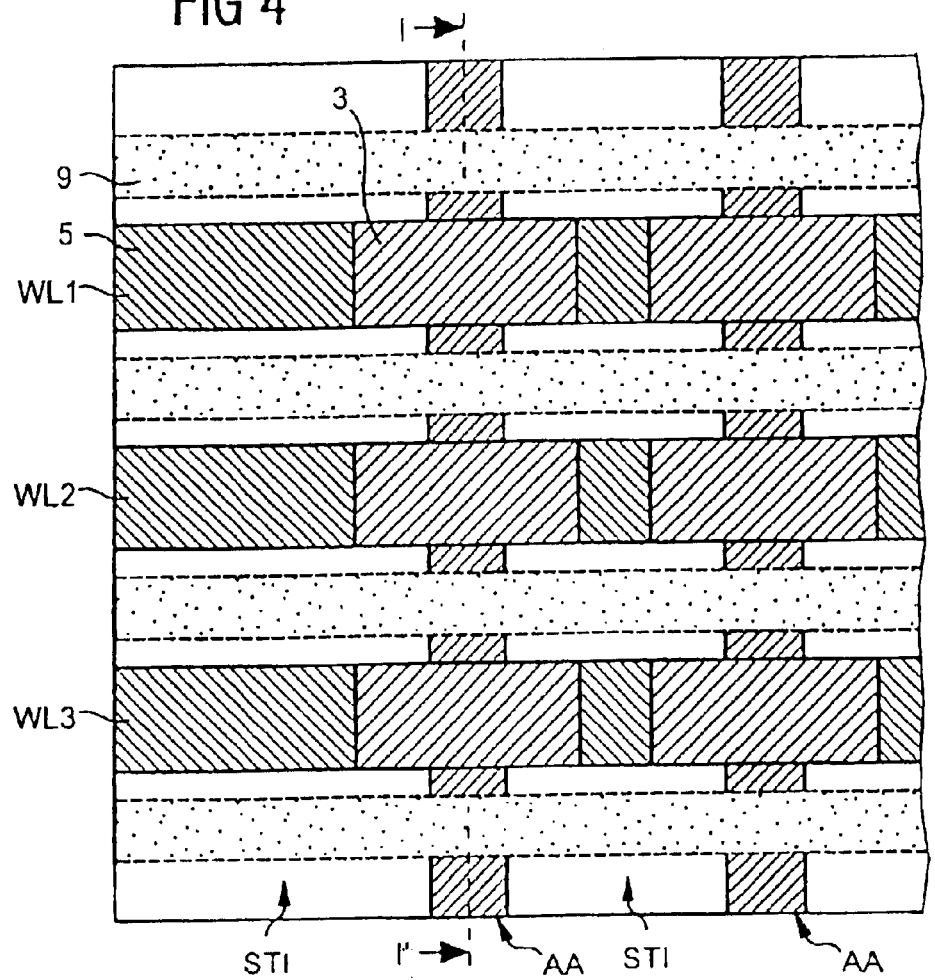

US 6,800,893 B2

SEMICONDUCTOR CIRCUIT CONFIGURATION AND ASSOCIATED FABRICATION METHOD

CROSS-REFERENCE TO RELATED APPLICATION

This application is a continuation of copending International Application No. PCT/DE01/04008, filed Oct. 22, 2001, which designated the United States and was not published in English.

BACKGROUND OF THE INVENTION

Field of the Invention

The present invention relates to a semiconductor circuit configuration and to an associated fabrication method and, in particular to a FLASH EPROM (erasable programmable memory) with a SNOR (selective NOR) architecture in which respective source and drain lines can be driven selectively.

In order to store relatively large volumes of data, magnetic disk drives are generally used at the present time by computer units or computers. However, such disk drives require a relatively large space and have a multiplicity of moving parts. Consequently, they are susceptible to disturbance and have a considerable current consumption. What is more, future computer units or computers and other digital devices such as, for example, digital cameras, music reproduction devices or palm devices or videos will become smaller and smaller, for which reason conventional mechanical storage devices are unsuitable.

As an alternative to such conventional mechanical storage devices, nonvolatile semiconductor memory devices have recently gained increasing acceptance. Such nonvolatile semiconductor memory devices are for example, FLASH memories, $E^2$PROM (electrically erasable programmable memory), EPROM and the like. The so-called NAND and NOR semiconductor memory devices are known as the most important representatives of such electrically erasable and electrically programmable memory devices. In both semiconductor memory devices, the memory cells have so-called one-transistor memory cells, and it is usually the case that a drain region and a source region are formed in an active region of a semiconductor substrate and an insulated charge-storing layer is situated above the channel section lying in between.

While a multiplicity of switching elements are connected to one another in series and are driven via a common selection gate or a selection transistor in NAND semiconductor circuit configurations, the respective switching elements are organized in parallel or in a matrix-type fashion in NOR semiconductor circuit configurations, as a result of which each switching element can be selected individually.

FIG. 1 shows a simplified illustration of a conventional SNOR semiconductor circuit configuration (selective NOR), in which, in contrast to the NOR semiconductor circuit configuration with a "common source" architecture, the individual switching elements (T1, T2, . . . ) are driven selectively via a respective source line SL1, SL2, . . . and via a respective drain line (DL1, DL2, . . . ). This selective driving is carried out, for example, by using respective bit line controllers BLC which, as it were, realize the common bit lines BL1, BL2, . . . In this way, it is possible to carry out further "shrinks" or a more extensive integration of the semiconductor circuit configuration since the SNOR architecture does not rely on a predetermined minimum cell transistor length or channel length.

FIG. 2 shows a simplified illustration of a conventional layout of the SNOR semiconductor circuit configuration in accordance with FIG. 1. In accordance with FIG. 2, the switching elements T1, T2, . . . are formed in active regions AA of a semiconductor substrate which have an essentially straight strip-type structure. On the multiplicity of strip-type active regions AA arranged column by column, there are superposed row by row layer stacks that are likewise formed in strip-type fashion. A topmost layer constitutes a control layer or word line WL1 to WL3 of the switching elements T1, T2, . . . Each crossover point or overlap region of such a strip-type active region AA with a word line WL1 to WL3 formed in strip-type fashion thus constitutes a multiplicity of switching elements T. The contact connection of respective drain regions D and source regions S requires contacts K, which are usually formed in the active region AA, but may often also extend into an adjoining isolation region STI (shallow trench isolation). The source lines SL1, SL2, . . . and also the drain lines DL1, DL2, . . . for the respective bit lines BL are then situated in a further overlying layer, which preferably constitutes a first metalization layer. In this case, the drain lines are connected via corresponding contacts K to the associated drain regions D of the active region. The source lines SL1 are connected in the same way via corresponding contacts to the associated source regions.

What is disadvantageous, however, in the case of such a conventional layout is that a more than twice as intensive metalization is present on account of the additional source lines in comparison with a "common source" architecture that represents a limiting factor for more extensive integration or further shrinks. What is more, so-called lithography artifacts are produced particularly in the case of source and drain lines configured in a meandering fashion, which artifacts can lead to a tapering through to interruptions of the respective lines.

In accordance with a further semiconductor circuit configuration (not illustrated), the active regions AA may also have so-called lugs or projections, as a result of which it is possible to alleviate the layout requirements for the source and drain lines. However, since a projection or a lug now has to be formed in the active region, problems once again arise in this region particularly during the lithographic realization.

SUMMARY OF THE INVENTION

It is accordingly an object of the invention to provide a semiconductor circuit configuration and also an associated fabrication method, which overcomes the above-mentioned disadvantages of the prior art apparatus and methods of this general type.

In particular, it is an object of the invention to provide a semiconductor circuit configuration and also an associated fabrication method in which a further integration can be realized in a simple manner.

With the foregoing and other objects in view there is provided, in accordance with the invention, a semiconductor circuit configuration including: a having a matrix of a plurality of switching elements; a plurality of essentially straight word lines for row by row driving the plurality of switching elements; a plurality of essentially straight bit lines for column by column driving the plurality of switching elements; and a plurality of electrically conductive connection elements located between the plurality of word lines. The plurality of switching elements have control layers essentially forming the plurality of word lines. The semiconductor substrate includes a plurality of essentially straight active regions. Each one of the plurality of switching elements includes a source region and a drain region spaced apart from the source region. The plurality of the active regions having the source region and the drain region of the plurality of switching elements formed therein. Each one of the plurality of bit lines has a source line for selectively driving the source region of a respective one of the plurality of switching elements. Each one of the plurality of bit lines has a drain line for selectively driving the drain region of a respective one of the plurality of switching elements. Some of the plurality of electrically conductive connection elements are for connecting the source regions of the plurality of switching elements to the source lines the plurality of bit lines. Some of the plurality of electrically conductive connection elements are for connecting the drain regions of the plurality of switching elements to the drain lines of the plurality of bit lines. The plurality of electrically conductive connection elements are formed by a plurality of connection strips. The semiconductor substrate has a surface and a plurality of trench isolations. Each one of the plurality of connection strips includes a portion directly making contact with the source region of a respective one of the plurality of switching elements at the surface of the semiconductor substrate or with the drain region of a respective one of the plurality of switching elements at the surface of the semiconductor substrate. Each one of the plurality of connection strips includes a remaining portion lying above one of the plurality of trench isolations.

With the foregoing and other objects in view there is provided, in accordance with the invention, a method for fabricating a semiconductor circuit configuration. The method includes: forming essentially straight active regions in a semiconductor substrate; forming a first insulating layer and a charge-storing layer; patterning the charge-storing layer; forming a second insulating layer, a first conductive layer, and a protective layer; forming essentially straight word line stacks by patterning the protective layer, the first conductive layer, the second insulating layer and the charge-storing layer; forming source regions and drain regions in the active regions of the semiconductor substrate; forming spacers on sidewalls of the word line stacks and removing portions of the first insulating layer that are not covered; forming a second conductive layer; uncovering the protective layer by reshaping the second conductive layer; forming individual connection strips by patterning the second conductive layer; forming a third insulating layer and source/drain contacts situated therein; and forming essentially straight source lines and essentially straight drain lines.

In particular as a result of using a multiplicity of electrically conductive connection strips for connecting the source and drain regions to the respective source lines and drain lines, and configuring the connection strips to be located between the word lines and directly making contact with the source and drain regions at the surface of the semiconductor substrate, an optimum layout results. This optimum layout is, namely an essentially rectilinear strip structure, and results both for the active region and for the source and drain lines, which makes it possible to prevent problems during the lithography. Furthermore, since the connection strips are formed by deposition and back formation directly between the word lines, a more extensive miniaturization of the cell area for a switching element is obtained.

The connection strip preferably has an in-situ-doped polysilicon, as a result of which a particularly good contact connection of the source and drain regions can be realized and the interspaces between the word lines are optimally filled on account of the outstanding filling properties.

Furthermore, the connection strips may have a siliconized polysilicon, as a result of which the conductivity is improved further and the access times to the switching element are improved further.

A nonvolatile one-transistor memory cell is preferably used as the switching element, as a result of which a nonvolatile memory with a maximum integration density is obtained.

The word lines preferably have an insulating protective layer, which acts as an etching stop layer and as a CMP (chemical mechanical polishing) detection layer, as a result of which a back formation of the connection strip layer, which is initially deposited over the whole area, can be effected in a very exact manner. The protective layer used is, by way of example, a silicon nitride which fulfills the functions as etching stop layer and CMP detection layer.

The essentially straight active regions are preferably formed by using shallow trench isolation in the semiconductor substrate, as a result of which a reliable isolation between the individual switching elements can be realized even with very small feature sizes.

Other features which are considered as characteristic for the invention are set forth in the appended claims.

Although the invention is illustrated and described herein as embodied in a semiconductor circuit configuration and associated fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a simplified cross sectional view of an inventive SNOR semiconductor circuit configuration;

FIGS. 4 and 5 are simplified plan views illustrating first fabrication steps for realizing the inventive SNOR semiconductor circuit configuration;

DESCRIPTION OF THE PREFERRED EMBODIMENTS

Figure 1:
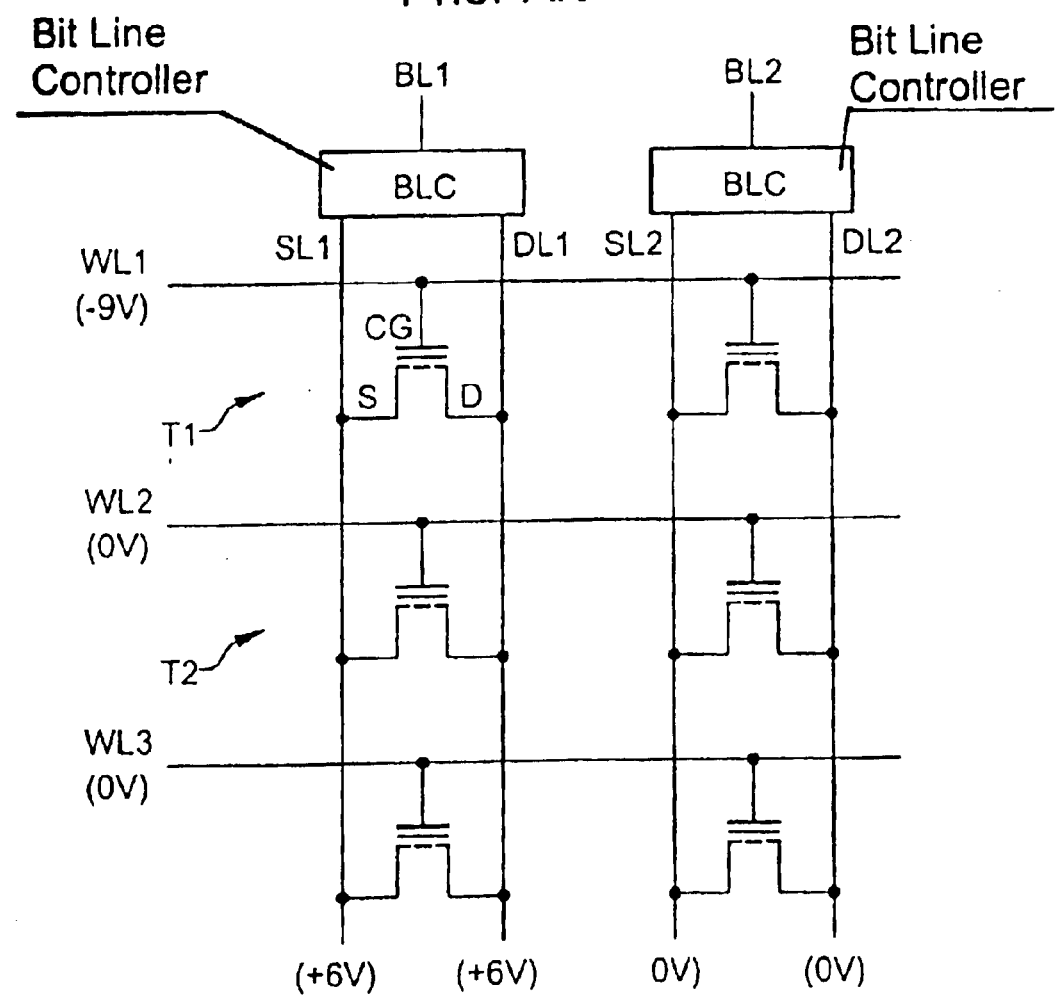
FIG. 1 is a simplified equivalent circuit diagram of a conventional SNOR semiconductor circuit configuration.
Figure 2:
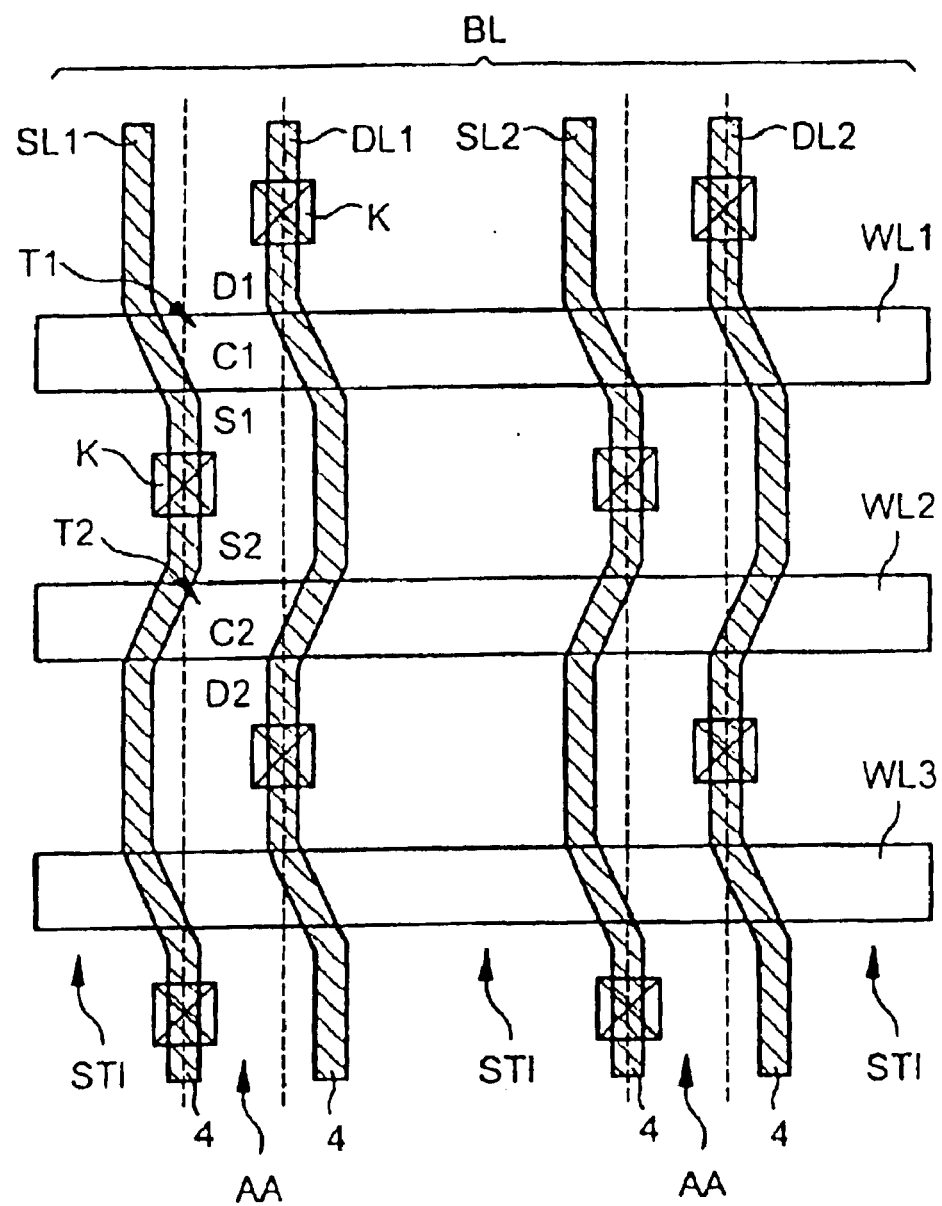
FIG. 2 is a simplified plan view of the conventional SNOR semiconductor circuit configuration shown in FIG. 1.

Referring now to the figures of the drawing in detail and first, particularly, to FIG. 3 thereof, there is shown a simplified cross sectional view of the SNOR semiconductor circuit configuration taken along the section line I—I shown in FIG. 4.

In order to fabricate the SNOR semiconductor circuit configuration illustrated in FIG. 3, first the fabrication steps that are described below, but are not illustrated in any further detail, are carried out. First, in a semiconductor substrate 1

(e.g. Si), essentially straight active regions AA are formed by way of trench isolation, for example, in particular a shallow trench isolation (STI). Since the active regions AA are formed such that they are essentially straight, no problems whatsoever arise during the lithography on account of edges or complicated geometrical shapes.

Afterward, a first insulating layer 2 is formed on the wafer surface or in the region of the active regions AA. This insulating layer 2 preferably constitutes a tunnel oxide layer and is formed as thermal silicon dioxide. However, the first insulating layer 2 may also be formed in the same way by a deposition method or by a different method. In the preferred exemplary embodiment, a switching element T includes a one-transistor memory cell, for which reason, in a subsequent step, a charge-storing layer 3 is formed preferably by deposition of a polysilicon as "floating gate". However, the invention is not restricted to such an electrically conductive charge-storing layer, but rather also encompasses electrically nonconductive charge-storing layers in the same way, as are used for example in so-called SONOS cells.

In order to realize charge-storing layers that are electrically isolated from one another, it is then possible to effect a first patterning of the charge-storing layer 3 in a further fabrication step. First, strip-type charge-storing layers are formed in the direction of the active regions AA. After this patterning step, which is usually carried out by photolithographic processes, a second insulating layer 4, a first conductive layer 5 and a protective layer 6 are deposited on the wafer in subsequent fabrication steps. A layer sequence including oxide/nitride/oxide (ONO) is preferably deposited as the second insulation layer 4. It is also possible, in principle, to use other dielectric insulating layers. By way of example, a further highly doped electrically conductive polysilicon layer is deposited as the first conductive layer 5, which polysilicon layer realizes a later word line. As an alternative, it is also possible to use low-resistance polycide or metallic word lines. A silicon nitride layer is preferably used as the protective layer 6 (cap layer), which silicon nitride layer is particularly expediently suitable as an etching stop layer and CMP detection layer for detecting a respective back-formation depth during later fabrication steps.

In a subsequent fabrication step, using a resist (not illustrated), by way of conventional lithography, essentially straight word line stacks are formed by patterning the protective layer 6, the first conductive layer 5, the second insulating layer 4, and the charge-storing layer 3. More precisely, first the protective layer 6 is subjected to dry etching using the resist and then the resist is removed. In a further dry etching step, the first conductive layer 5 is etched selectively with respect to the second insulating layer 4 preferably by dry etching using the protective layer 6 as a mask, and then the second insulating layer 4 and also the charge-storing layer 3 are subjected to dry etching in the same way selectively with respect to the first insulating layer 2. Finally, an aftertreatment of the etched word line stack is effected, in which case, by way of example, polymers are removed and the wafer surface is cleaned.

In an optional additional fabrication step, side insulating layers 8 may be formed, preferably as oxide, on the sidewalls, in which a thermal oxidation is preferably carried out. Afterward, source and drain regions S/D are formed in the active regions AA of the semiconductor substrate 1 in a self-aligning manner preferably by ion implantation using the word line stacks, and symmetrical junctions are usually used. Asymmetrical p/n junctions may be realized for example by using additional masking steps.

Afterward, so-called spacers 7 preferably made of silicon nitride are formed on the sidewalls of the word line stacks preferably by carrying out a deposition and anisotropic etching-back of a nitride layer, for example. In this case, the protective layer 6 and the thickness of the spacers 7 are designed in such a way as to constitute a sufficient protection for the further process steps.

After the removal of the first insulating layer 2, which may also actually be removed at an earlier point in time, a second conductive layer 9 is formed over the whole area on the wafer in a subsequent fabrication step. An LPCVD deposition (low pressure chemical vapor deposition) of in-situ-doped polysilicon is preferably carried out for this purpose, as a result of which the interspaces between the parallel word line stacks are filled completely and without the formation of gaps or voids. In this case, the second conductive layer 9 directly makes contact with the source and drain regions S/D at the surface of the semiconductor substrate 1, in which case, particularly when $n^+$-type in-situ-doped polysilicon is used, the junction acquires an ohmic behavior and, during a thermal aftertreatment, for example, the semiconductor substrate 1 or the source and drain regions S/D formed therein are doped further by the outdiffusion of dopants from the polysilicon of the second conductive layer 9. The possibility also optionally exists of replacing the ion implantation described above by a diffusion of this type, in which case the source/drain regions can be formed directly by the outdiffusion of dopants from the second conductive layer 9.

In a subsequent fabrication step, the second conductive layer 9 is reshaped or in other words is subjected to back formation in order to uncover the protective layer 6 and the spacers 7. A chemical mechanical polishing (CMP) of the polysilicon layer 9 as far as the nitride layer or protective layer 6 and the spacers 7 is preferably effected. In this case, the nitride layer of the protective layer 6 and of the spacers 7 serves as an etching stop layer and, moreover, as a CMP detection layer by way of which the uncovering of the protective layer 6 can be reliably detected and excessive deep polishing is prevented. In particular with the use of highly doped polysilicon for the second conductive layer 9 and nitride for the protective layer 6 and the spacers 7, back formation of the second conductive layer 9 can thus be effected in a particularly simply manner.

By way of example, in a subsequent step, the second conductive layer 9 may be made to recede further or may be removed—an anisotropic and/or isotropic etching method being employed. Short circuits between the second conductive layer 9 that is now formed in strip-type fashion can be reliably prevented in this way. In accordance with FIG. 3, the space between respective word line stacks is completely filled with the second conductive layer 9 after this fabrication step.

FIG. 4 shows a plan view of the SNOR semiconductor circuit configuration after the fabrication steps described above. Identical reference symbols designate layers or elements identical to those in FIG. 3 for which reason a repeated description is dispensed with below.

It shall be pointed out at this juncture that a logic region (not illustrated) for driving the matrix array is completely covered by the charge-storing layer 3, the second insulating layer 4, the first conductive layer 5 and the protective layer 6, and it is only at this point in time that this layer stack is completely removed and the entire logic region or the circuit thereof is formed. However, the logic circuits can also be formed at a different point in time in the logic region.

Figure 5:
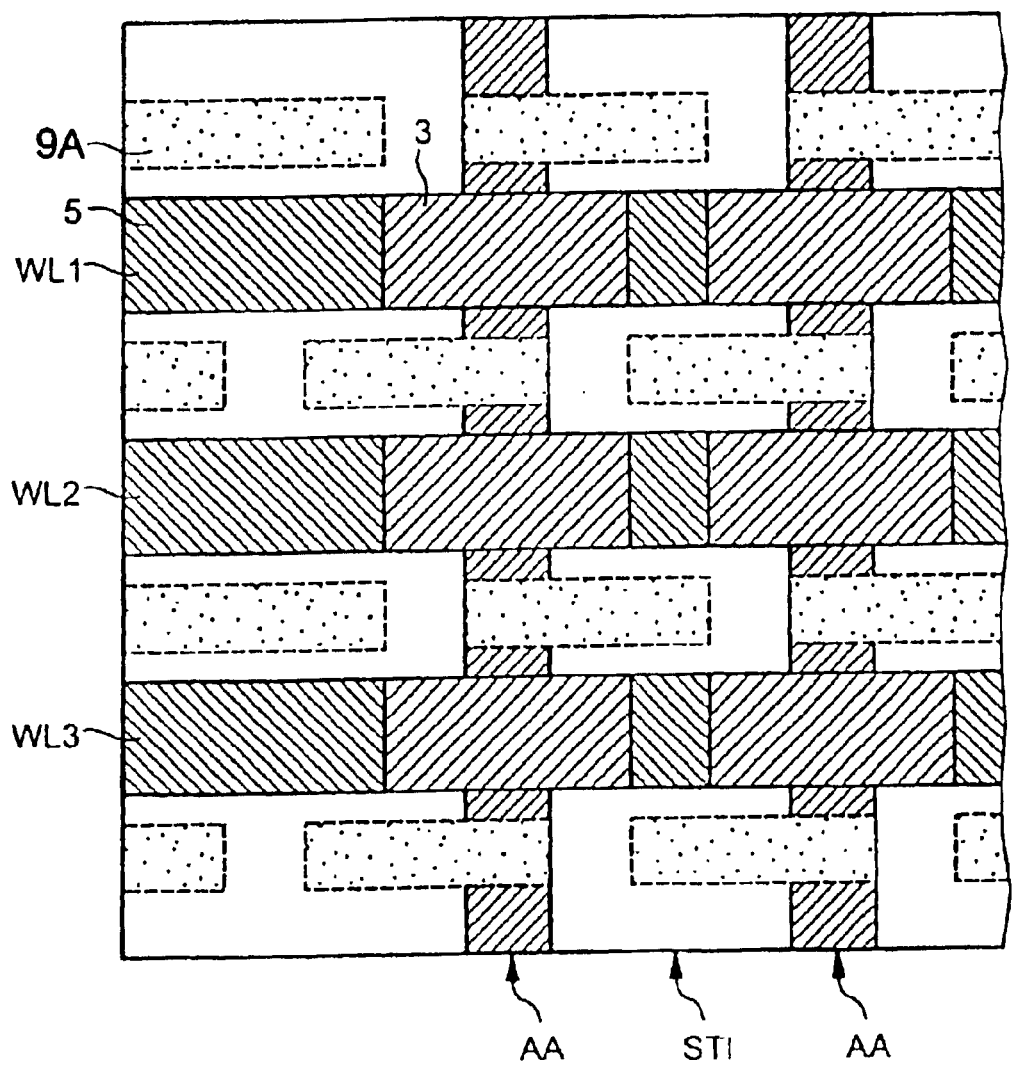
Figure 6:
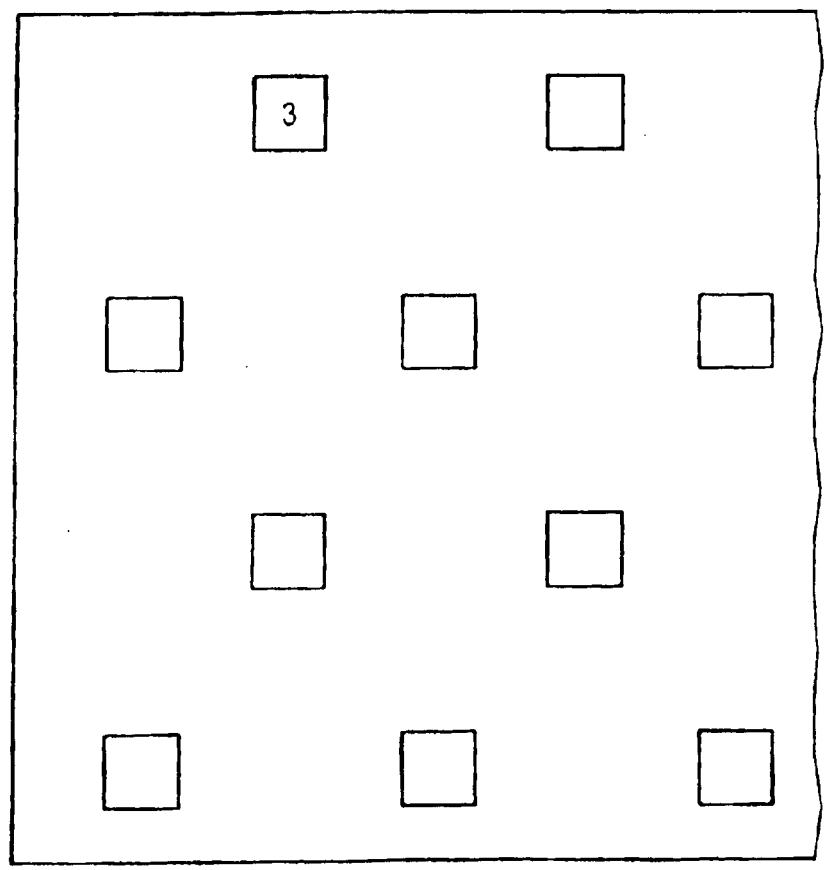
FIG. 6 is a plan view of a mask required for forming the connection strips.

FIG. 5 is a plan view in accordance with a further fabrication step of the SNOR semiconductor circuit configuration according to the invention. Identical reference symbols again designate identical layers or elements and a repeated description is dispensed with below. In order to realize individual strip pieces or connection strips 9A, by using a special mask illustrated in FIG. 6, the second conductive layer 9 is interrupted at regular intervals in such a way that at least a portion of the connection strips 9A directly makes contact with the surface of the semiconductor substrate at the source and drain regions (S/D) or the active region AA, while the remaining portion lies above the trench isolation STI. In order to remove these small strip pieces, an anisoptropic etching of the second conductive layer 9 is preferably carried out. A misalignment in this mask process is relatively unproblematic since the word line stacks are covered with the protective layer 6 and the spacers 7, which act as an etching stop layer. In particular by using silicon nitride for the protective layer 6 and the spacer 7, a selected etching of the polysilicon tracks or the second conductive layer 9 is obtained in a particularly simple manner, and even relatively large misalignments do not pose any problems.

Figure 7:
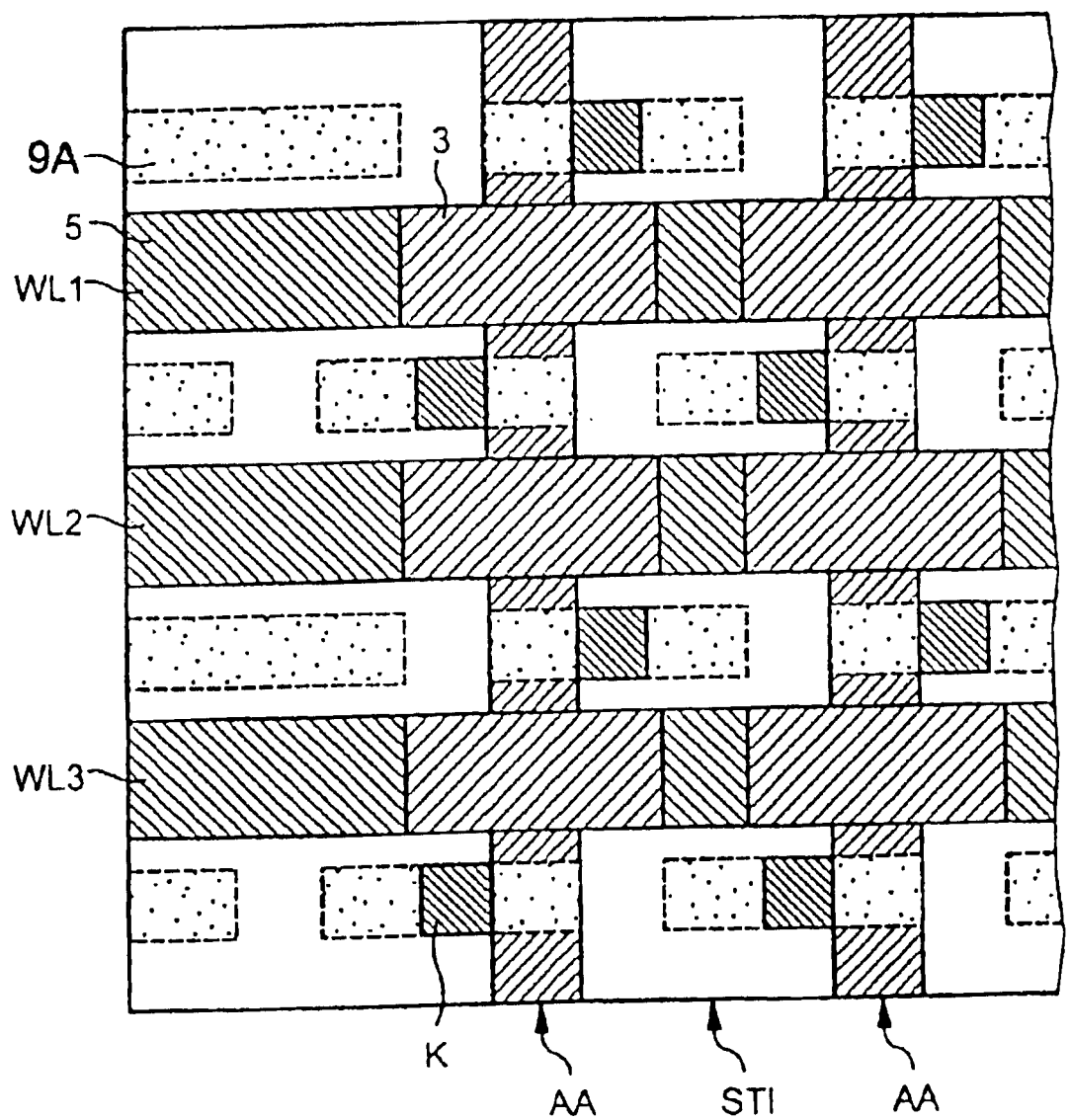
FIGS. 7 and 8 show simplified plan views of further fabrication steps for realizing the inventive SNOR semiconductor circuit configuration.

A third insulating layer 11 is subsequently formed, which insulating layer, as an intermediate electric layer (ILD, inter-layer dielectric) preferably includes flowable BPSG (borophosphorus-doped silicate glass). The etched-free gaps can be perfectly closed or filled in this way. In accordance with FIG. 7, in a subsequent fabrication step, essentially above the trench isolation STI and at the locations of the connection strips 9, contact holes are etched free in the third insulating layer 11 and contacts K are formed. Metallic material is preferably used for these contacts K, but highly doped polysilicon or semiconductor material can be used in the same way. Misalignment is once again unproblematic during the uncovering of the contact openings and during the deposition or formation of the actual contacts K, since the underlying protective layer 6 and also the spacers 7 of the word line stacks act as a reliable etching stop layer and, moreover, have a high insulation capability. For the contact etching, a perfect so-called "stopping liner" is obtained in particular by using silicon nitride and polysilicon for the second conductive layer. Therefore, the requirements made of alignment accuracy are very low, and in the extreme case in accordance with FIG. 7, it is even possible to fabricate so-called borderless contacts.

In a subsequent metalization step, the contacts K are covered with a whole-area metalization layer 10, which is subsequently patterned to form essentially rectilinear source lines SL1, SL2, ... and drain lines DL1, DL2 ... Since the contacts K now lie sufficiently far outside the active region AA, it is possible to dispense with the difficult-to-fabricate meandering structures with their lithographic artifacts, thus yielding a particularly simple lithography (essentially rectilinear) for the entire fabrication process. What is more, such a straight structure has the further advantage that it enables a maximum integration density and promotes the use of regular contact masks.

Since the second conductive layer 9 for the connection areas are not formed lithographically, but rather are produced by filling intermediate regions, it is possible to produce sublithographic structures that further reduce a cell area. Accordingly, in accordance with FIG. 8, an area for a switching element T amounts to $2F*4F=8F^2$, where F represents a smallest structure width that can be realized lithographically in a respective method. In particular on account of the selectivity with respect to the protective layer 6 during the contact etching and a sufficient overlap region of the connection strip 9A, an extraordinarily high alignment tolerance is obtained for the contacts K, which is manifested in low fabrication costs and an increased yield.

Figure 8:
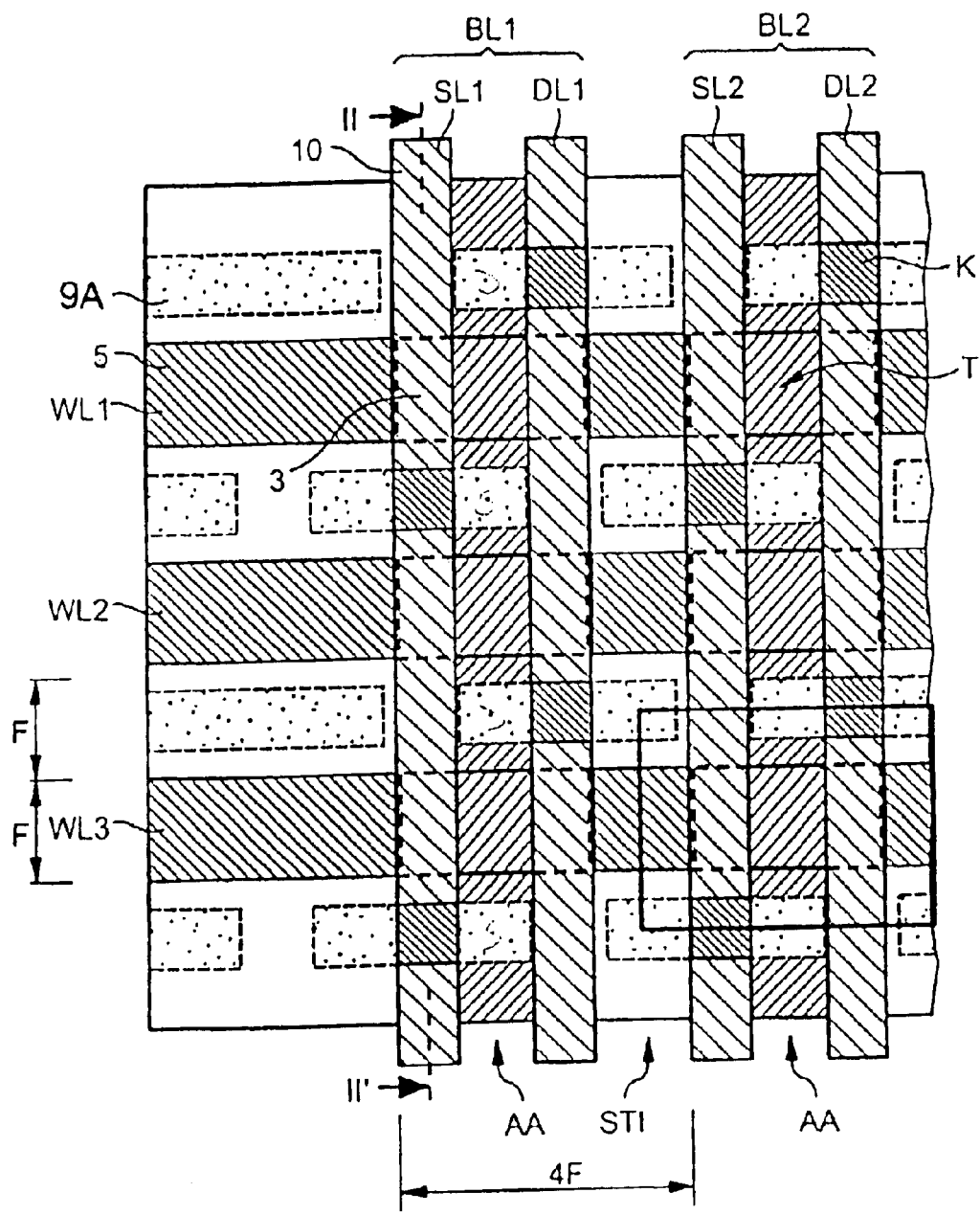
Figure 9:
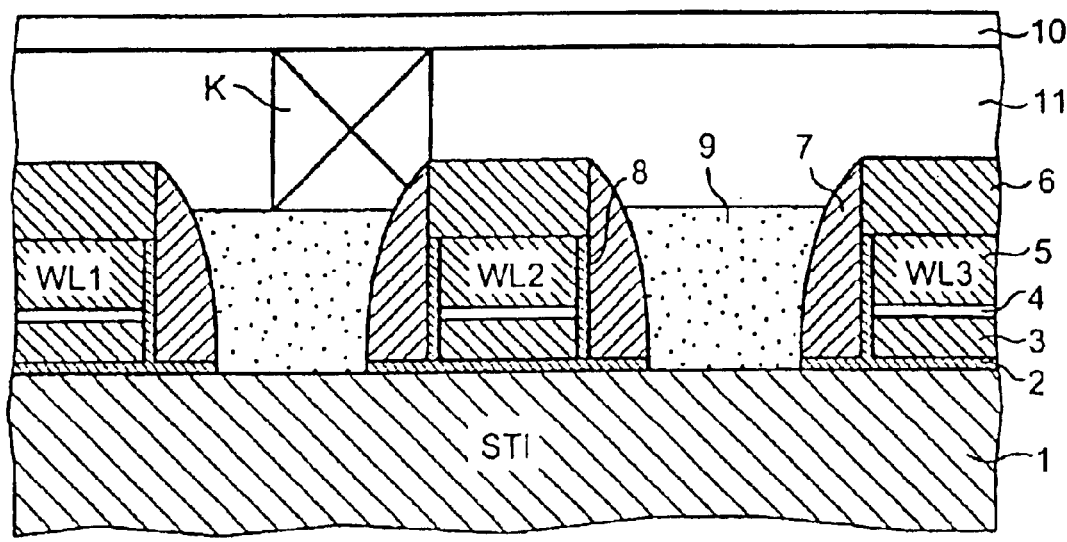
FIG. 9 is a simplified cross sectional view of the SNOR semiconductor circuit configuration taken along the section line II-II' shown in FIG. 8.

FIG. 9 is a simplified cross sectional view of the SNOR semiconductor configuration taken along the section line II-II' shown in FIG. 8. Identical reference symbols designate layers or elements identical to those in FIGS. 3 to 7 and a repeated description is dispensed with below.

An above-described misalignment of a contact K is illustrated in accordance with FIG. 9. The contact hole partly lies on the protective layer 6 and the spacer 7 of a word line stack. However, since this layer or the spacer acts as an etching stop layer for the formation of the contact hole in the third insulating layer 11 as well, there is no risk whatsoever of destroying the word lines or producing a short circuit. Even minimal points of contact between the contact K and the source or drain line 10 and/or the second conductive layer 9 suffice for a functional circuit configuration.

The invention has been described above on the basis of connection strips including in-situ-doped polysilicon. However, it is not restricted thereto and encompasses in the same way connection strips that have a siliconized polysilicon. Furthermore, the connection strips may also have a metal, in which case TiN, WN, TaN, etc. may be used, for example. In the same way, highly doped polysilicon, polycide, siliconized polysilicon and/or a metal may also be used for the word lines or the first conductive layer.

We claim:

1. A semiconductor circuit configuration, comprising:

having a matrix of a plurality of switching elements;

a plurality of essentially straight word lines for row by row driving said plurality of switching elements;

a plurality of essentially straight bit lines for column by column driving said plurality of switching elements; and a plurality of electrically conductive connection elements located between said plurality of word lines;

said plurality of switching elements having control layers essentially forming said plurality of word lines;

said semiconductor substrate including a plurality of essentially straight active regions;

each one of said plurality of switching elements including a source region and a drain region spaced apart from said source region;

said plurality of said active regions having said source region and said drain region of each one of said plurality of switching elements formed therein;

each one of said plurality of bit lines having a source line for selectively driving said source region of a respective one of said plurality of switching elements;

each one of said plurality of bit lines having a drain line for selectively driving said drain region of a respective one of said plurality of switching elements;

said plurality of electrically conductive connection elements for connecting said source region of each one of said plurality of switching elements to said source line of a respective one of said plurality of bit lines;

said plurality of electrically conductive connection elements for connecting said drain region of each one of said plurality of switching elements to said drain line of a respective one of said plurality of bit lines;

said plurality of electrically conductive connection elements formed by a plurality of connection strips;

said semiconductor substrate having a surface and a plurality of trench isolations;

each one of said plurality of connection strips including a portion directly making contact with said source region of a respective one of said plurality of switching elements at said surface of said semiconductor substrate or with said drain region of a respective one of said plurality of switching elements at said surface of said semiconductor substrate; and each one of said plurality of connection strips including a remaining portion lying above one of said plurality of trench isolations.

2. The semiconductor circuit configuration according to claim 1, wherein said plurality of connection strips include in-situ-doped polysilicon.

3. The semiconductor circuit configuration according to claim 1, wherein said plurality of connection strips include siliconized polysilicon.

4. The semiconductor circuit configuration according to claim 1, wherein said plurality of connection strips include a metal.

5. The semiconductor circuit configuration according to claim 1, wherein each one of said plurality of said switching elements includes a nonvolatile one-transistor memory cell having a first insulating layer, a charge-storing layer, a second insulating layer, and one of said control layers.

6. The semiconductor circuit configuration according to claim 1, wherein each one of said plurality of word lines has an insulating protective layer acting as an etching stop layer and/or a CMP detection layer.

7. The semiconductor circuit configuration according to claim 6, wherein said insulating protective layer includes silicon nitride.

8. The semiconductor circuit configuration according to claim 1, wherein said plurality of active regions are formed using said plurality of shallow trench isolations in said semiconductor substrate.

9. A method for fabricating a semiconductor circuit configuration, which comprises:

forming essentially straight active regions in a semiconductor substrate;

forming a first insulating layer and a charge-storing layer;

patterning the charge-storing layer;

forming a second insulating layer, a first conductive layer, and a protective layer;

forming essentially straight word line stacks by patterning the protective layer, the first conductive layer, the second insulating layer and the charge-storing layer;

forming source regions and drain regions in the active regions of the semiconductor substrate;

forming spacers on sidewalls of the word line stacks and removing portions of the first insulating layer that are not covered;

forming a second conductive layer;

uncovering the protective layer by reshaping the second conductive layer;

forming individual connection strips by patterning the second conductive layer;

forming a third insulating layer and source/drain contacts situated therein; and forming essentially straight source lines and essentially straight drain lines.

10. The method according to claim 9, wherein the step of forming the essentially straight active regions includes using a shallow trench isolation.

11. The method according to claim 9, wherein the step of forming the charge-storing layer includes forming the charge-storing layer as an electrically conductive or electrically nonconductive individual layer.

12. The method according to claim 9, wherein the protective layer and the spacers act as a reshaping protective layer and detection layer.

13. The method according to claim 12, which comprises forming a silicon nitride layer.

14. The method according to claim 9, wherein the step of forming the source regions and the drain regions includes performing a self-aligning ion implantation.

15. The method according to claim 9, wherein the step of forming the second conductive layer includes forming an in-situ-doped polysilicon layer.

16. The method according to claim 9, wherein the step of forming the second conductive layer includes forming an in-situ-doped polysilicon layer by performing an LPCVD deposition.

17. The method according to claim 9, wherein the step of reshaping the second conductive layer includes performing a chemical mechanical polishing step until the protective layer is reached.

18. The method according to claim 17, which comprises performing a further etching-back of the second conductive layer.

19. The method according to claim 9, wherein the step of forming the third insulating layer includes forming a BPSG layer as the third insulating layer.

20. The method according to claim 9, wherein the step of forming the charge-storing layer includes forming the charge-storing layer as an electrically conductive and/or electrically nonconductive multilayer.

* * * * *